United States Patent
Huang et al.

(10) Patent No.: US 8,947,163 B2
(45) Date of Patent: Feb. 3, 2015

(54) SPLIT CAPACITORS SCHEME FOR SUPPRESSING OVERSHOOT VOLTAGE GLITCHES IN CLASS D AMPLIFIER OUTPUT STAGE

(71) Applicants: Chenling Huang, San Diego, CA (US); Haibo Fei, San Diego, CA (US); Matthew D. Sienko, San Diego, CA (US)

(72) Inventors: Chenling Huang, San Diego, CA (US); Haibo Fei, San Diego, CA (US); Matthew D. Sienko, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/628,011

(22) Filed: Sep. 26, 2012

(65) Prior Publication Data

US 2013/0293298 A1 Nov. 7, 2013

Related U.S. Application Data

(60) Provisional application No. 61/641,791, filed on May 2, 2012.

(51) Int. Cl.
*H03F 3/217* (2006.01)

(52) U.S. Cl.
CPC ................................... *H03F 3/217* (2013.01)
USPC .................. 330/251; 330/207 A; 327/309

(58) Field of Classification Search
CPC ....................................................... H03F 3/217

USPC .................... 330/10, 251, 207 A; 327/309
See application file for complete search history.

(56) References Cited

U.S. PATENT DOCUMENTS

| | | | |
|---|---|---|---|
| 6,781,458 B2 * | 8/2004 | Mazda | 330/251 |
| 7,737,776 B1 | 6/2010 | Cyrusian | |
| 7,839,215 B2 | 11/2010 | Mendenhall | |
| 7,898,783 B2 | 3/2011 | Kaya | |
| 2008/0012632 A1 * | 1/2008 | Tsuji et al. | 327/559 |
| 2012/0008240 A1 | 1/2012 | Jiang et al. | |

FOREIGN PATENT DOCUMENTS

EP 0500818 B1 10/1995

OTHER PUBLICATIONS

International Search Report and Written Opinion—PCT/US2013/035680—ISA/EPO—Jun. 21, 2013.

* cited by examiner

*Primary Examiner* — Robert Pascal
*Assistant Examiner* — Khiem Nguyen
(74) *Attorney, Agent, or Firm* — Howard Seo

(57) ABSTRACT

A class D power amplifier is provided. The class D power amplifier includes a class D driver circuit having a plurality of output transistors, at least one active clamp circuit coupled to at least one output transistor of the plurality of output transistors, and at least one filter bank circuit coupled to the at least one active clamp circuit for controlling a voltage of the at least one output transistor. Accordingly, a voltage across a drain node and source node (VDS), a voltage across a gate node and source node (VGS), and a voltage across the gate node and drain node (VGD) of the output transistors is reduced to increase reliability of the power amplifier while consuming less power and utilizing less die area.

21 Claims, 6 Drawing Sheets

SPLIT CAPACITORS SCHEME FOR SUPPRESSING OVERSHOOT VOLTAGE GLITCHES IN CLASS D AMPLIFIER OUTPUT STAGE

CROSS-REFERENCE TO RELATED APPLICATION(S)

This application claims the benefit of U.S. Provisional Application Ser. No. 61/641,791, entitled "SPLIT CAPACITORS SCHEME FOR SUPPRESSING OVERSHOOT VOLTAGE GLITCHES IN CLASS D AMPLIFIER OUTPUT STAGE" and filed on May 2, 2012, which is expressly incorporated by reference herein in its entirety.

BACKGROUND

1. Field

The present disclosure relates generally to electronic circuits, and more particularly, to suppressing overshoot voltage glitches in a class D amplifier.

2. Background

Portable electronic devices are widely deployed to provide various capabilities such as viewing and hearing of video, music, voice, and other multimedia. In order to hear the audio portion of these capabilities, an audio amplifier is used to drive a speaker to produce sounds. Additionally, the audio source signal types can be of varying quality and bandwidth. Accommodating the myriad of source signal types can increase the complexity of an audio amplifier design.

There is a continual growth of users of portable devices which have the ability to play audio in its various forms while keeping a device size to a minimum. To minimize the size of a device, manufacturers typically incorporate increasing functionality into an application specific integrated circuit (ASIC) instead of discrete components. In order to amplify an audio signal so that it can drive an external speaker, the power amplifier must be able to increase the power of the source signal.

Output amplifiers are commonly used in various applications such as audio power amplifiers, telephone line drivers, etc. Output amplifiers may be categorized into different classes such as class A, class B, class AB, and class D. Class A, B, and AB amplifiers are linear amplifiers that operate in a linear region. Class D amplifiers are switch mode amplifiers that operate in triode and cut-off regions. Consequently, class D amplifiers can typically achieve much higher power efficiency than linear amplifiers.

SUMMARY

A class D power amplifier may include a plurality of output transistors. However, due to VDD and VSS ringing, a voltage across a drain node and source node (VDS), a voltage across a gate node and source node (VGS), and a voltage across the gate node and drain node (VGD) of the output transistors may be so high to cause the class D power amplifier to lose reliability, and eventually cause device failure. Previous solutions to reduce the VDS, VGS, and VGD of the output transistors involve using a filter bank circuit having a large capacitor that uses a large die area, or employing use of a supply clamp that consumes a large amount of power. Accordingly, what is needed is a class D amplifier that consumes less power and utilizes less die area.

In an aspect of the disclosure, a class D power amplifier is provided. The class D power amplifier includes a class D driver circuit having a plurality of output transistors, at least one active clamp circuit coupled to at least one output transistor of the plurality of output transistors, and at least one filter bank circuit coupled to the at least one active clamp circuit for controlling a voltage of the at least one output transistor.

DETAILED DESCRIPTION

Figure 1:
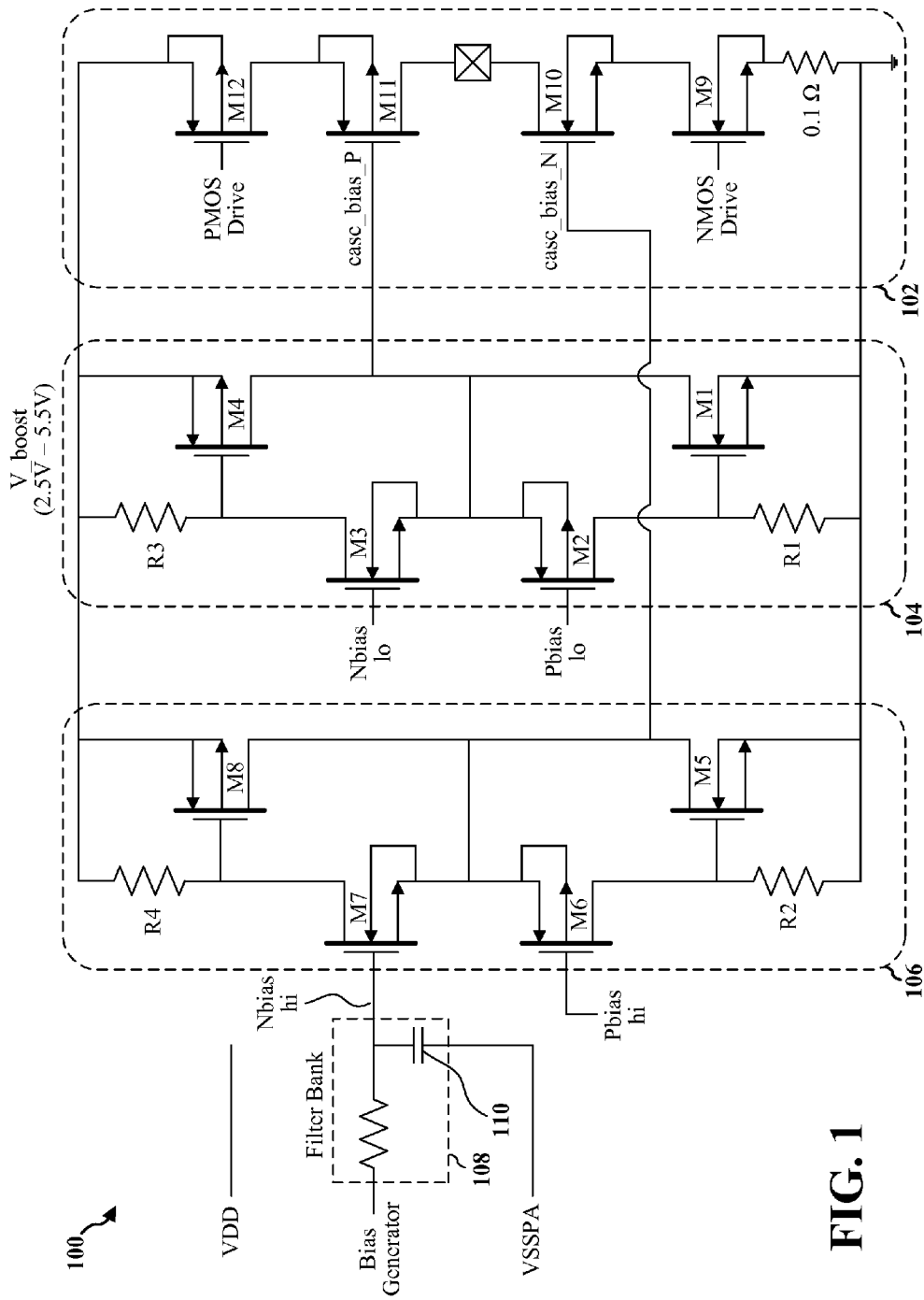
FIG. 1 is a diagram illustrating a class D power amplifier having an active clamp circuit and a filter bank circuit coupled to the active clamp circuit.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of electronic circuits will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Parasitic inductance from on-chip or printed circuit board (PCB) routing causes ringing on both a VDD bus and VSS bus of a class D power amplifier. Due to the ringing, output stage transistors of the class D amplifier are overstressed. For example, with a 4 Ohm load and high output, a voltage across a drain node and source node (VDS), a voltage across a gate node and source node (VGS), and a voltage across the gate node and drain node (VGD) of an output transistor may be so high that the class D power amplifier loses reliability.

The problem of parasitic inductance, as well as overshoot voltages generated from the parasitic inductance, is difficult to control. The problem is increased when considering shrinking device feature sizes and corresponding tolerance voltages. Accordingly, the present disclosure provides a solution to the problem of parasitic inductance and overshoot voltages in a class D amplifier that consumes less power and utilizes less die area.

FIG. 1 is a diagram 100 illustrating a class D power amplifier having an active clamp circuit and a filter bank circuit coupled to the active clamp circuit. Referring to FIG. 1, in an aspect of the disclosure, the class D power amplifier includes a class D driver circuit 102 having a plurality of transistors M9, M10, M11, and M12, wherein the transistors M10 and M11 are output transistors. The class D driver circuit 102 may be referred to as a class D cascode driver.

One or more active clamp circuits may be coupled to the class D driver circuit 102. For example, a first active clamp circuit 104 may be coupled to the output transistor M11, and a second active clamp circuit 106 may be coupled to the output transistor M10. The first active clamp circuit 104 may be referred to as an active clamp circuit for a P cascode device of the class D driver circuit 102. The second active clamp circuit 106 may be referred to as an active clamp circuit for an N cascode device of the class D driver circuit 102. The first active clamp circuit 104 may include a plurality of transistors M1, M2, M3, and M4. The second active clamp circuit 106 may include a plurality of transistors M5, M6, M7, and M8.

Additionally, one or more filter bank circuits may be coupled to each active clamp circuit. For example, as shown in FIG. 1, a filter bank circuit 108 may be coupled to the transistor M7 of the second active clamp circuit 106. In FIG. 1, although only one filter bank circuit 108 is shown, the present disclosure allows for the transistor M6 of the second active clamp circuit 106, and the transistors M2 and M3 of the first active clamp circuit 104 to respectively be coupled with a filter bank circuit 108.

Referring to FIG. 1, a bias voltage for the transistors M2 and M3 of the second active clamp circuit 106, and the transistors M6 and M7 of the first active clamp circuit 104 will pass through the filter bank circuit 108 (e.g., RC filter bank) to remove any high frequency glitches when an output is switching. However, due to VDD and VSS ringing, a voltage across a drain node and source node (VDS), a voltage across a gate node and source node (VGS), and a voltage across the gate node and drain node (VGD) of the output transistors M10 and M11 may be greater than 5 V, for example. This results in reliability failure or even device failure.

To reduce the VDS, VGS, and VGD of the output transistors M10 and M11, a capacitor 110 of the filter bank circuit 108 would need to be a 400 pF decoupling capacitor on chip. However, using such a large capacitor would require more die area. Alternatively, a supply clamp may be used to reduce the VDS, VGS, and VGD. However, such a solution consumes 50% more power.

Figures 2A, 2B:
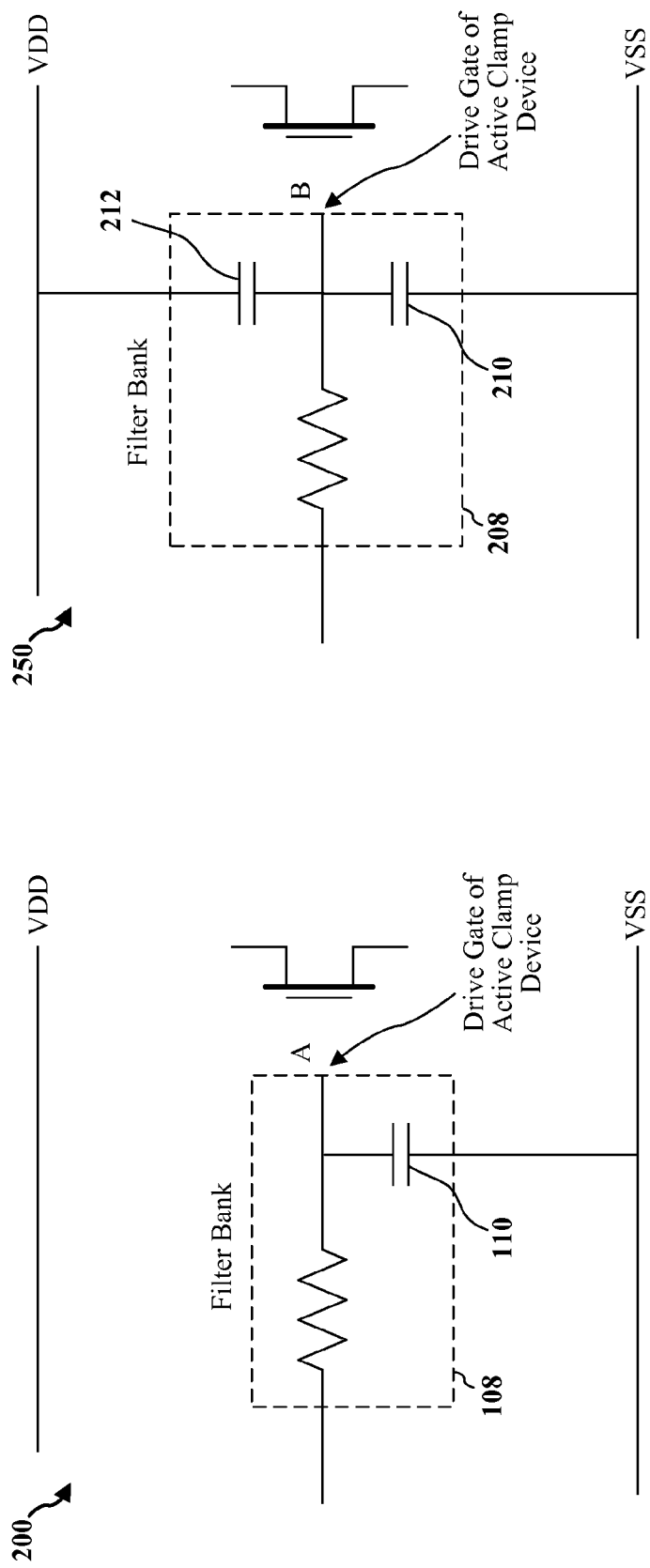
FIG. 2A is a diagram illustrating a first type of filter bank circuit.
FIG. 2B is a diagram illustrating a second type of filter bank circuit.

FIG. 2A is a diagram 200 illustrating a first type of filter bank circuit. FIG. 2B is a diagram 250 illustrating a second type of filter bank circuit. Referring to FIG. 2A, the filter bank circuit 108 is the same as the filter bank circuit described with respect to FIG. 1. In the filter bank circuit 108, the filter bank is disposed toward one side of the supply (e.g., VSS or VSSPA). This causes a node A (see filter bank circuit 108 of FIG. 2A) to suffer a differential glitch. Thus, the active clamp circuits coupled with the filter bank circuit 108 experience unequal overstress voltage for different output states.

In the filter bank circuit 208 of FIG. 2B, two split capacitors are used within the filter bank circuit. Specifically, a first capacitor 212 is connected between VDD and a node B, and a second capacitor 210 is connected between VSS and the node B. By using the two split capacitors in the filter bank circuit, VDS, VGS, and VGD of the output transistors M10 and M11 may be reduced while consuming less power and die area than the filter bank circuit 108 of FIG. 2A utilizing a single capacitor. The node B of the filter bank circuit 208 sees approximately half of the differential swing between VDD and VSS compared to the node A of the filter bank circuit 108. Consequently, the stabilized node B holds the gate voltage of the output transistors M10 and M11 within a narrow range so that overstress voltage is significantly reduced.

Figure 3:
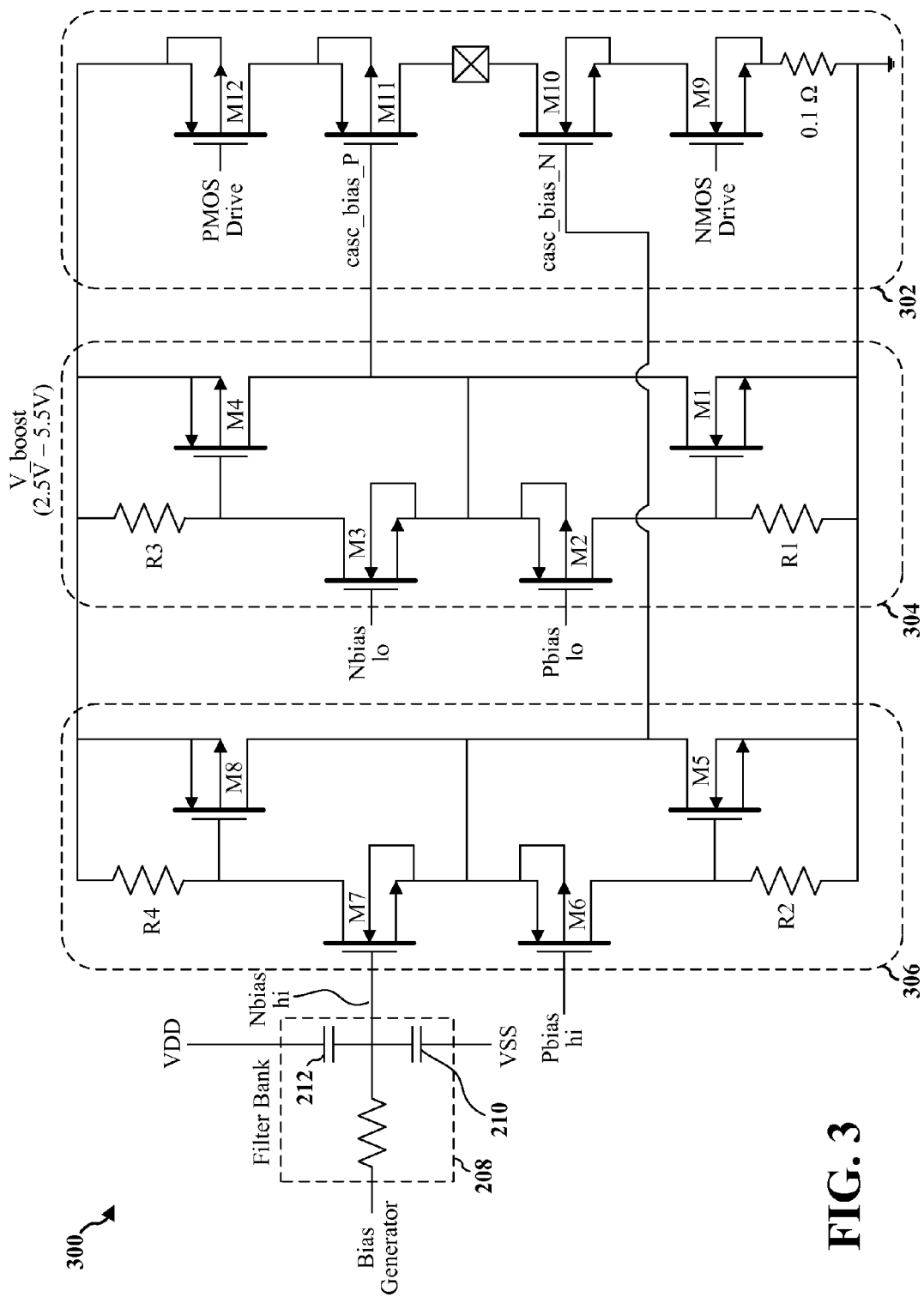
FIG. 3 is a diagram illustrating a class D power amplifier having at least one active clamp circuit and a filter bank circuit coupled to the at least one active clamp circuit.

FIG. 3 is a diagram 300 illustrating a class D power amplifier having at least one active clamp circuit and a filter bank circuit coupled to the at least one active clamp circuit. Referring to FIG. 3, in an aspect of the disclosure, the class D power amplifier includes a class D driver circuit 302 having a plurality of transistors M9, M10, M11, and M12, wherein transistors M10 and M11 are output transistors. One or more active clamp circuits may be coupled to the class D driver circuit 302. For example, a first active clamp circuit 304 may be coupled to the output transistor M11, and a second active clamp circuit 306 may be coupled to the output transistor M10. The first active clamp circuit 304 may include a plurality of transistors M1, M2, M3, and M4. The second active clamp circuit 306 may include a plurality of transistors M5, M6, M7, and M8.

Additionally, one or more filter bank circuits 208 may be coupled to each active clamp circuit for controlling a voltage of the output transistors M10 and M11. The filter bank circuit 208 of FIG. 3 is the same as the filter bank circuit 208 described with respect to FIG. 2. As shown in FIG. 3, a filter bank circuit 208 may be coupled to the transistor M7 of the second active clamp circuit 306. In FIG. 3, although only one filter bank circuit 208 is shown, the present disclosure allows for the transistor M6 of the second active clamp circuit 306, and the transistors M2 and M3 of the first active clamp circuit 304 to respectively be coupled with a filter bank circuit 208. For example, a first filter bank circuit 208 may be coupled to a gate node of the transistor M2, a second filter bank circuit 208 may be coupled to a gate node of the transistor M3, a third filter bank circuit 208 may be coupled to a gate node of the transistor M6, and a fourth filter bank circuit may be coupled to a gate node of the transistor M7.

In an aspect, the filter bank circuit 208 stabilizes a voltage of an active clamp circuit for controlling a voltage of an output transistor. Each of the output transistors M10 and M11 of the class D driver circuit 302 comprises a gate node, a drain node, and a source node. The first active clamp circuit 304 may comprise clamping transistors M2 and M3. The second active clamp circuit 306 may comprise clamping transistors M6 and M7. Each of the clamping transistors M2, M3, M6, M7 comprise a clamping transistor gate node, a clamping transistor drain node, and a clamping transistor source node. The source nodes of the clamping transistors M2 and M3 may be coupled to the gate node of the output transistor M11. Also, the source nodes of the clamping transistors M6 and M7 may be coupled to the gate node of the output transistor M10.

The filter bank circuit 208 may be coupled to the clamping transistor gate node of a clamping transistor (M2, M3, M6, M7). The filter bank circuit stabilizes a voltage at the clamping transistor gate node for controlling a voltage at the gate node of an output transistor M10 or M11 of the class D driver circuit 302. The controlled voltage at the gate node of the output transistor M10, M11 reduces at least one of: 1) a voltage across the gate node and source node (VGS) of the output transistor; 2) a voltage across the gate node and drain node (VGD) of the output transistor; or 3) a voltage across the drain node and source node (VDS) of the output transistor.

In an aspect, the filter bank circuit comprises a first capacitor 212 having a first node and second node and a second capacitor 210 having a first node and a second node. The first node of the first capacitor 212 is coupled to a supply voltage of the class D power amplifier. The second node of the first capacitor 212 is coupled to the first node of the second capacitor 210 and a clamping transistor gate node. The first node of the second capacitor 210 is coupled to the second node of the first capacitor 212 and the clamping transistor gate node. The second node of the second capacitor 210 is coupled to a ground node.

Table 1 below shows simulated overstress voltages of a class D power amplifier using a filter bank circuit with split capacitors (FIG. 3). In Table 1, the voltages of output transistor M11 is shown as it may suffer more than the output transistor M10. As seen, the overstress voltage is reduced by almost 1.3 V when compared to overstress voltages of a class D power amplifier using a filter bank circuit without split capacitors.

TABLE 1

| Without Split Capacitors | | | With Split Capacitors | | |
|---|---|---|---|---|---|
| M11 VGS | M11 VGD | M11 VDS | M11 VGS | M11 VGD | M11 VDS |
| 4.861 V | 5.067 V | 5.665 V | 4.541 V | 3.62 V | 4.39 V |

In addition, using the filter bank circuit of FIG. 3 with split capacitors is not overly sensitive to the capacitors mismatching. Table 3 below shows that even with a 10% mismatch in the capacitors used, the mismatch only causes 3-4% more overshoot voltages.

TABLE 2

| | M11 VGS | M11 VGD | M11 VDS |
|---|---|---|---|
| Perfect Match | 4.541 V | 3.62 V | 4.39 V |
| 10% Mismatch | 4.525 V | 3.7 V | 4.395 V |

Figure 4:
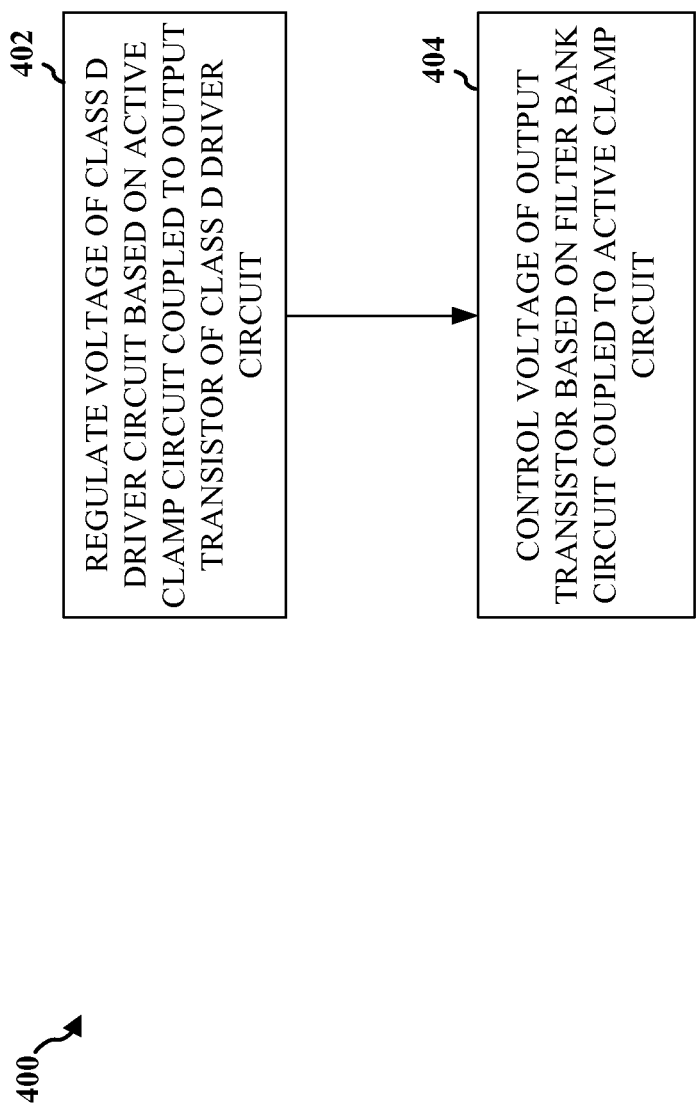
FIG. 4 is a flow chart of a method of suppressing an overshoot voltage glitch in a class D amplifier.

FIG. 4 is a flow chart 400 of a method of suppressing an overshoot voltage glitch in a class D amplifier. The class D amplifier includes a class D driver circuit having a plurality of output transistors. The method may be performed by the class D amplifier. At step 402, the class D amplifier regulates a voltage of the class D driver circuit based on at least one active clamp circuit coupled to at least one output transistor of the plurality of output transistors. Thereafter, at step 404, the class D amplifier controls a voltage of the at least one output transistor based on at least one filter bank circuit coupled to the at least one active clamp circuit. The voltage of the at least one output transistor may be controlled by stabilizing the voltage of the at least one active clamp circuit with the at least one filter bank circuit.

Each of the plurality of output transistors of the class D driver circuit includes a gate node, a drain node, and a source node. The at least one active clamp circuit includes at least one clamping transistor. The at least one clamping transistor includes a clamping transistor gate node, a clamping transistor drain node, and a clamping transistor source node. The voltage of the at least one output transistor may be controlled by controlling a voltage at the gate node of the at least one output transistor based on the at least one filter bank circuit coupled to the clamping transistor gate node, wherein the at least one filter bank circuit stabilizes a voltage at the clamping transistor gate node.

In an aspect, the controlled voltage at the gate node of the at least one output transistor reduces at least one of a voltage across the gate node and source node of the at least one output transistor, a voltage across the gate node and drain node of the at least one output transistor, or a voltage across the drain node and source node of the at least one output transistor.

In a further aspect, the at least one filter bank circuit includes a first capacitor having a first node and second node, and a second capacitor having a first node and a second node. The first node of the first capacitor is coupled to a supply voltage of the class D power amplifier. The second node of the first capacitor is coupled to the first node of the second capacitor and the clamping transistor gate node. The first node of the second capacitor is coupled to the second node of the first capacitor and the clamping transistor gate node. The second node of the second capacitor is coupled to a ground node.

In another aspect, the plurality of output transistors of the class D driver circuit includes a first output transistor and a second output transistor. Moreover, the at least one active clamp circuit includes a first active clamp circuit and a second active clamp circuit. The first active clamp circuit is coupled to the first output transistor, and the second active clamp circuit is coupled to the second output transistor.

The first active clamp circuit includes a first clamping transistor and a second clamping transistor. The source node of the first clamping transistor and the source node of the second clamping transistor are coupled to the gate node of the first output transistor. The second active clamp circuit includes a third clamping transistor and a fourth clamping transistor. The source node of the third clamping transistor and the source node of the fourth clamping transistor are coupled to the gate node of the second output transistor.

In a further aspect, the at least one filter bank circuit includes a first filter bank circuit coupled to the gate node of the first clamping transistor. A second filter bank circuit is coupled to the gate node of the second clamping transistor. A third filter bank circuit is coupled to the gate node of the third clamping transistor. A fourth filter bank circuit is coupled to the gate node of the fourth clamping transistor.

Figure 5:
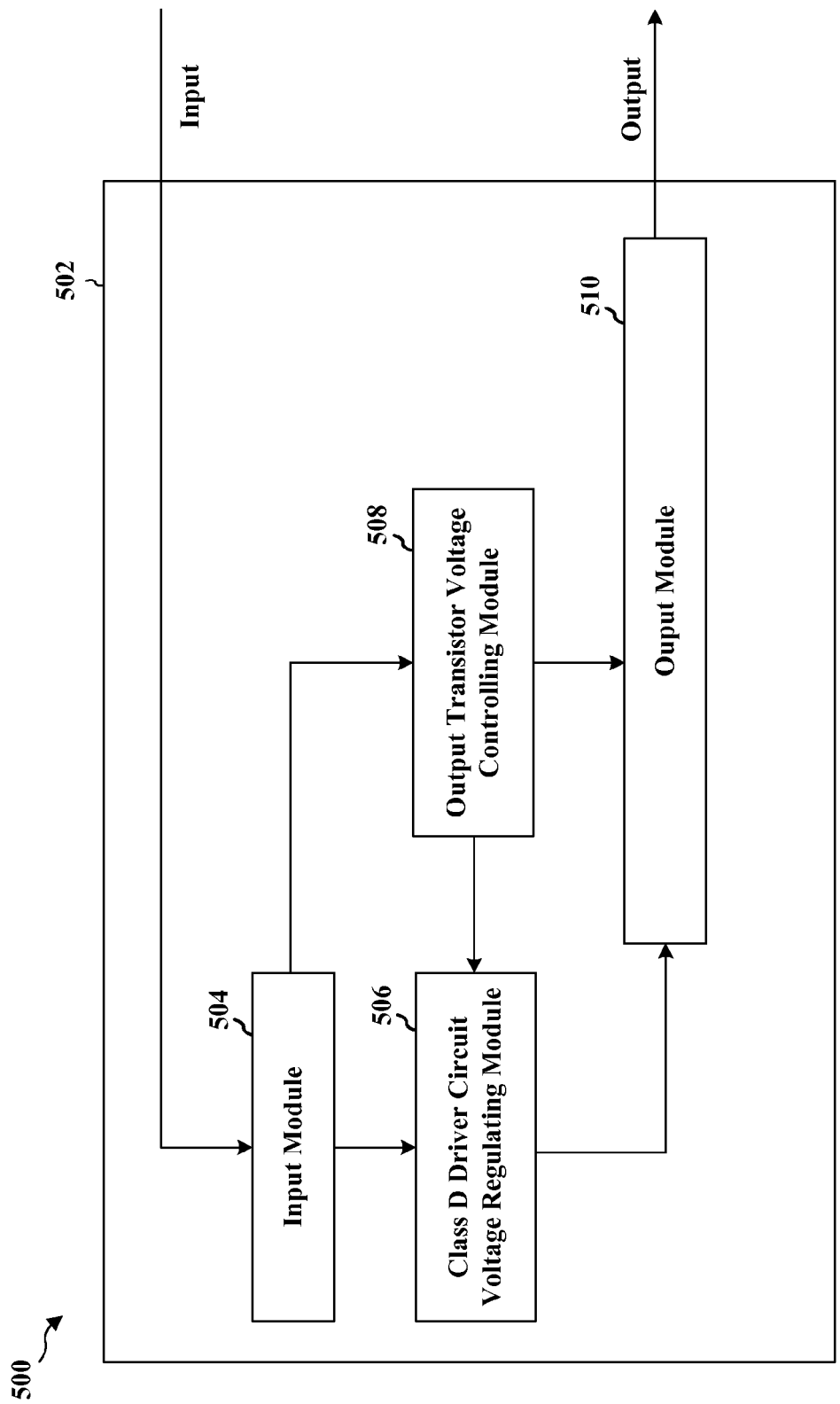
FIG. 5 is a conceptual data flow diagram illustrating the data flow between different modules/means/components in an exemplary apparatus.

FIG. 5 is a conceptual data flow diagram 500 illustrating the data flow between different modules/means/components in an exemplary apparatus 502. The apparatus may be a class D amplifier having a plurality of output transistors. The apparatus includes an input module 504 that receives an input, a class D driver circuit voltage regulating module 506, an output transistor voltage controlling module 508, and an output module 510 that sends an output.

The class D driver circuit voltage regulating module 506 regulates a voltage of the class D driver circuit based on at least one active clamp circuit coupled to at least one output transistor of the plurality of output transistors. Thereafter, the output transistor voltage controlling module 508 controls a voltage of the at least one output transistor based on at least one filter bank circuit coupled to the at least one active clamp circuit. The voltage of the at least one output transistor may be controlled by stabilizing the voltage of the at least one active clamp circuit with the at least one filter bank circuit.

Each of the plurality of output transistors of the class D driver circuit includes a gate node, a drain node, and a source node. The at least one active clamp circuit includes at least one clamping transistor. The at least one clamping transistor includes a clamping transistor gate node, a clamping transistor drain node, and a clamping transistor source node. The voltage of the at least one output transistor may be controlled by controlling a voltage at the gate node of the at least one output transistor based on the at least one filter bank circuit coupled to the clamping transistor gate node, wherein the at least one filter bank circuit stabilizes a voltage at the clamping transistor gate node.

In an aspect, the controlled voltage at the gate node of the at least one output transistor reduces at least one of a voltage across the gate node and source node of the at least one output transistor, a voltage across the gate node and drain node of the at least one output transistor, or a voltage across the drain node and source node of the at least one output transistor.

In a further aspect, the at least one filter bank circuit includes a first capacitor having a first node and second node, and a second capacitor having a first node and a second node. The first node of the first capacitor is coupled to a supply voltage of the class D power amplifier. The second node of the first capacitor is coupled to the first node of the second capacitor and the clamping transistor gate node. The first node of the second capacitor is coupled to the second node of the first capacitor and the clamping transistor gate node. The second node of the second capacitor is coupled to a ground node.

In another aspect, the plurality of output transistors of the class D driver circuit includes a first output transistor and a second output transistor. Moreover, the at least one active clamp circuit includes a first active clamp circuit and a second active clamp circuit. The first active clamp circuit is coupled to the first output transistor, and the second active clamp circuit is coupled to the second output transistor.

The first active clamp circuit includes a first clamping transistor and a second clamping transistor. The source node of the first clamping transistor and the source node of the second clamping transistor are coupled to the gate node of the first output transistor. The second active clamp circuit includes a third clamping transistor and a fourth clamping transistor. The source node of the third clamping transistor and the source node of the fourth clamping transistor are coupled to the gate node of the second output transistor.

In a further aspect, the at least one filter bank circuit includes a first filter bank circuit coupled to the gate node of the first clamping transistor. A second filter bank circuit is coupled to the gate node of the second clamping transistor. A third filter bank circuit is coupled to the gate node of the third clamping transistor. A fourth filter bank circuit is coupled to the gate node of the fourth clamping transistor.

The apparatus may include additional modules that perform each of the steps of the algorithm in the aforementioned flow chart of FIG. 4. As such, each step in the aforementioned flow chart of FIG. 4 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 6:
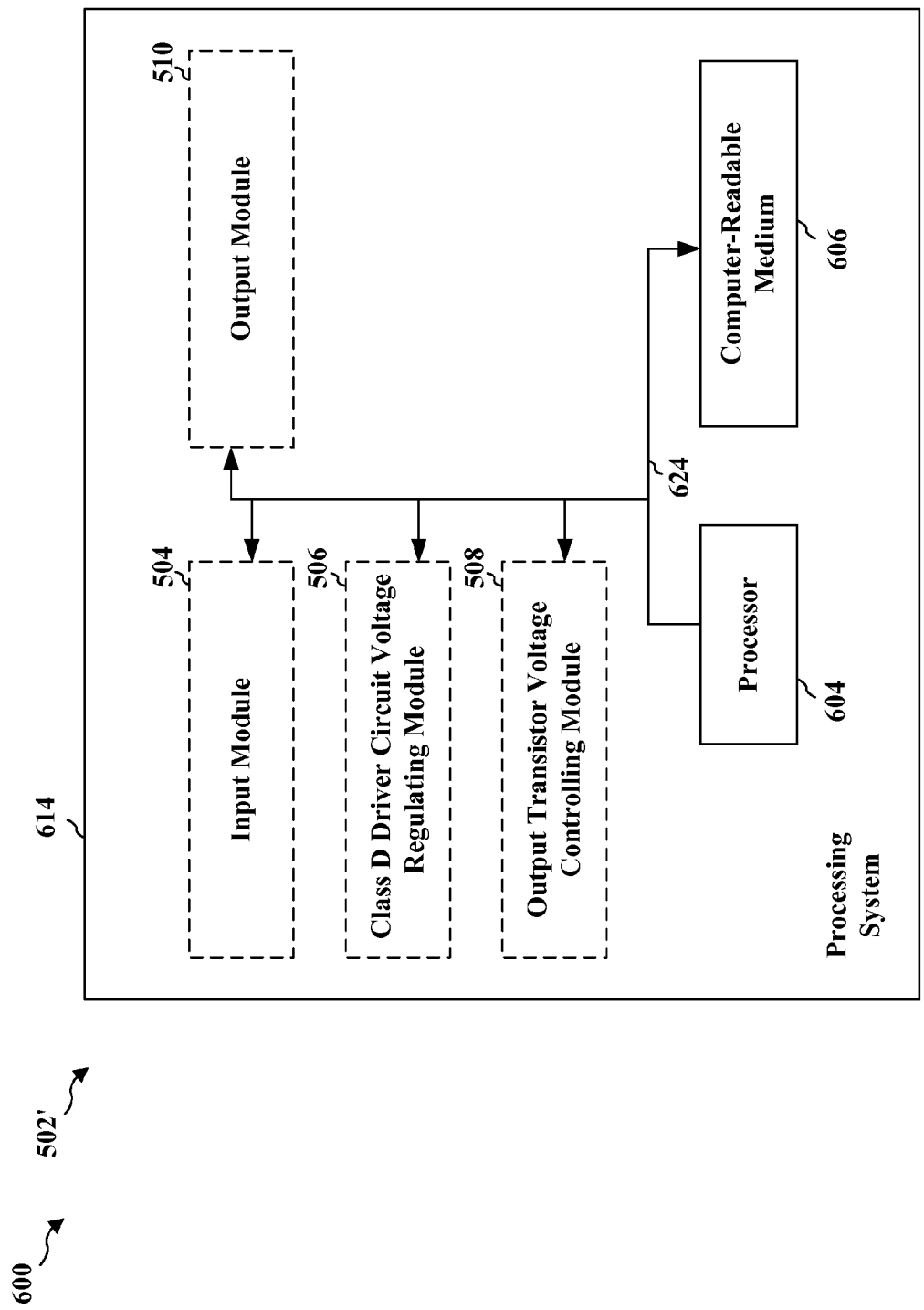
FIG. 6 is a diagram illustrating an example of a hardware implementation for an apparatus employing a processing system.

FIG. 6 is a diagram 600 illustrating an example of a hardware implementation for an apparatus 502' employing a processing system 614. The processing system 614 may be implemented with a bus architecture, represented generally by the bus 624. The bus 624 may include any number of interconnecting buses and bridges depending on the specific application of the processing system 614 and the overall design constraints. The bus 624 links together various circuits including one or more processors and/or hardware modules, represented by the processor 604, the modules 504, 506, 508, 510, and the computer-readable medium 606. The bus 624 may also link various other circuits such as timing sources, peripherals, voltage regulators, and power management circuits, which are well known in the art, and therefore, will not be described any further.

The processing system 614 includes a processor 604 coupled to a computer-readable medium 606. The processor 604 is responsible for general processing, including the execution of software stored on the computer-readable medium 606. The software, when executed by the processor 604, causes the processing system 614 to perform the various functions described supra for any particular apparatus. The computer-readable medium 606 may also be used for storing data that is manipulated by the processor 604 when executing software. The processing system further includes at least one of the modules 504, 506, 508, and 510. The modules may be software modules running in the processor 604, resident/stored in the computer readable medium 606, one or more hardware modules coupled to the processor 604, or some combination thereof.

In one configuration, the apparatus 502/502' for suppressing an overshoot voltage glitch in a class D amplifier having a plurality of output transistors includes means for regulating a voltage of the class D driver circuit based on at least one active clamp circuit coupled to at least one output transistor of the plurality of output transistors, and means for controlling a voltage of the at least one output transistor based on at least one filter bank circuit coupled to the at least one active clamp circuit. The aforementioned means may be one or more of the aforementioned modules of the apparatus 502 and/or the processing system 614 of the apparatus 502' configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A class D power amplifier, comprising:
   a class D driver circuit having a plurality of output transistors;
   at least one active clamp circuit coupled to at least one output transistor of the plurality of output transistors; and
   at least one filter bank circuit coupled to the at least one active clamp circuit for controlling a voltage of the at least one output transistor,
   wherein the at least one active clamp circuit comprises at least one clamping transistor, the at least one clamping transistor comprising a clamping transistor gate node, a clamping transistor drain node, and a clamping transistor source node, and
   wherein the at least one filter bank circuit comprises:
      a first capacitor having a first node and a second node, and
      a second capacitor having a first node and a second node,
      the first node of the first capacitor coupled to a supply voltage of the class D power amplifier,
      the second node of the first capacitor coupled to the first node of the second capacitor and the clamping transistor gate node,
      the first node of the second capacitor coupled to the second node of the first capacitor and the clamping transistor gate node, and
      the second node of the second capacitor coupled to a ground node.

2. The class D power amplifier of claim 1, wherein the at least one filter bank circuit stabilizes a voltage of the at least one active clamp circuit for controlling the voltage of the at least one output transistor.

3. The class D power amplifier of claim 1, wherein:
   each of the plurality of output transistors of the class D driver circuit comprises a gate node, a drain node, and a source node; and
   the at least one filter bank circuit is coupled to the clamping transistor gate node, wherein the at least one filter bank circuit stabilizes a voltage at the clamping transistor gate node for controlling a voltage at the gate node of the at least one output transistor.

4. The class D power amplifier of claim 3, wherein the controlled voltage at the gate node of the at least one output transistor reduces at least one of:
   a voltage across the gate node and source node of the at least one output transistor;
   a voltage across the gate node and drain node of the at least one output transistor; or
   a voltage across the drain node and source node of the at least one output transistor.

5. The class D power amplifier of claim 1, wherein:
   the plurality of output transistors of the class D driver circuit comprises a first output transistor and a second output transistor; and
   the at least one active clamp circuit comprises a first active clamp circuit and a second active clamp circuit, the first active clamp circuit coupled to the first output transistor, and the second active clamp circuit coupled to the second output transistor.

6. The class D power amplifier of claim 5, wherein:
   the first active clamp circuit comprises a first clamping transistor and a second clamping transistor, the source node of the first clamping transistor and the source node of the second clamping transistor coupled to the gate node of the first output transistor; and
   the second active clamp circuit comprises a third clamping transistor and a fourth clamping transistor, the source node of the third clamping transistor and the source node of the fourth clamping transistor coupled to the gate node of the second output transistor.

7. The class D power amplifier of claim 6, wherein the at least one filter bank circuit comprises:
   a first filter bank circuit coupled to the gate node of the first clamping transistor;
   a second filter bank circuit coupled to the gate node of the second clamping transistor;
   a third filter bank circuit coupled to the gate node of the third clamping transistor; and
   a fourth filter bank circuit coupled to the gate node of the fourth clamping transistor.

8. A method of suppressing an overshoot voltage glitch in a class D amplifier, the class D amplifier including a class D driver circuit having a plurality of output transistors, the method comprising:
   regulating a voltage of the class D driver circuit based on at least one active clamp circuit coupled to at least one output transistor of the plurality of output transistors; and
   controlling a voltage of the at least one output transistor based on at least one filter bank circuit coupled to the at least one active clamp circuit,
   wherein the at least one active clamp circuit comprises at least one clamping transistor, the at least one clamping transistor comprising a clamping transistor gate node, a clamping transistor drain node, and a clamping transistor source node, and
   wherein the at least one filter bank circuit comprises:
      a first capacitor having a first node and a second node, and
      a second capacitor having a first node and a second node,
      the first node of the first capacitor coupled to a supply voltage of the class D power amplifier,
      the second node of the first capacitor coupled to the first node of the second capacitor and the clamping transistor gate node,
      the first node of the second capacitor coupled to the second node of the first capacitor and the clamping transistor gate node, and the second node of the second capacitor coupled to a ground node.

9. The method of claim 8, wherein the controlling the voltage of the at least one output transistor comprises stabilizing the voltage of the at least one active clamp circuit with the at least one filter bank circuit.

10. The method of claim 8, wherein:
each of the plurality of output transistors of the class D driver circuit comprises a gate node, a drain node, and a source node; and
the controlling the voltage of the at least one output transistor comprises controlling a voltage at the gate node of the at least one output transistor based on the at least one filter bank circuit coupled to the clamping transistor gate node, wherein the at least one filter bank circuit stabilizes a voltage at the clamping transistor gate node.

11. The method of claim 10, wherein the controlled voltage at the gate node of the at least one output transistor reduces at least one of:
a voltage across the gate node and source node of the at least one output transistor;
a voltage across the gate node and drain node of the at least one output transistor; or
a voltage across the drain node and source node of the at least one output transistor.

12. The method of claim 8, wherein:
the plurality of output transistors of the class D driver circuit comprises a first output transistor and a second output transistor; and
the at least one active clamp circuit comprises a first active clamp circuit and a second active clamp circuit, the first active clamp circuit coupled to the first output transistor, and the second active clamp circuit coupled to the second output transistor.

13. The method of claim 12, wherein:
the first active clamp circuit comprises a first clamping transistor and a second clamping transistor, the source node of the first clamping transistor and the source node of the second clamping transistor coupled to the gate node of the first output transistor; and
the second active clamp circuit comprises a third clamping transistor and a fourth clamping transistor, the source node of the third clamping transistor and the source node of the fourth clamping transistor coupled to the gate node of the second output transistor.

14. The method of claim 13, wherein the at least one filter bank circuit comprises:
a first filter bank circuit coupled to the gate node of the first clamping transistor;
a second filter bank circuit coupled to the gate node of the second clamping transistor;
a third filter bank circuit coupled to the gate node of the third clamping transistor; and
a fourth filter bank circuit coupled to the gate node of the fourth clamping transistor.

15. An apparatus for suppressing an overshoot voltage glitch in a class D amplifier, the class D amplifier including a class D driver circuit having a plurality of output transistors, the apparatus comprising:
means for regulating a voltage of the class D driver circuit based on at least one active clamp circuit coupled to at least one output transistor of the plurality of output transistors; and
means for controlling a voltage of the at least one output transistor based on at least one filter bank circuit coupled to the at least one active clamp circuit,
wherein the at least one active clamp circuit comprises at least one clamping transistor, the at least one clamping transistor comprising a clamping transistor gate node, a clamping transistor drain node, and a clamping transistor source node, and
wherein the at least one filter bank circuit comprises:
a first capacitor having a first node and a second node, and
a second capacitor having a first node and a second node,
the first node of the first capacitor coupled to a supply voltage of the class D power amplifier,
the second node of the first capacitor coupled to the first node of the second capacitor and the clamping transistor gate node,
the first node of the second capacitor coupled to the second node of the first capacitor and the clamping transistor gate node, and
the second node of the second capacitor coupled to a ground node.

16. The apparatus of claim 15, wherein the means for controlling the voltage of the at least one output transistor is configured to stabilize the voltage of the at least one active clamp circuit with the at least one filter bank circuit.

17. The apparatus of claim 15, wherein:
each of the plurality of output transistors of the class D driver circuit comprises a gate node, a drain node, and a source node; and
the means for controlling the voltage of the at least one output transistor is configured to control a voltage at the gate node of the at least one output transistor based on the at least one filter bank circuit coupled to the clamping transistor gate node, wherein the at least one filter bank circuit stabilizes a voltage at the clamping transistor gate node.

18. The apparatus of claim 17, wherein the controlled voltage at the gate node of the at least one output transistor reduces at least one of:
a voltage across the gate node and source node of the at least one output transistor;
a voltage across the gate node and drain node of the at least one output transistor; or
a voltage across the drain node and source node of the at least one output transistor.

19. The apparatus of claim 15, wherein:
the plurality of output transistors of the class D driver circuit comprises a first output transistor and a second output transistor; and
the at least one active clamp circuit comprises a first active clamp circuit and a second active clamp circuit, the first active clamp circuit coupled to the first output transistor, and the second active clamp circuit coupled to the second output transistor.

20. The apparatus of claim 19, wherein:
the first active clamp circuit comprises a first clamping transistor and a second clamping transistor, the source node of the first clamping transistor and the source node of the second clamping transistor coupled to the gate node of the first output transistor; and
the second active clamp circuit comprises a third clamping transistor and a fourth clamping transistor, the source node of the third clamping transistor and the source node of the fourth clamping transistor coupled to the gate node of the second output transistor.

21. The apparatus of claim 20, wherein the at least one filter bank circuit comprises:
a first filter bank circuit coupled to the gate node of the first clamping transistor;

a second filter bank circuit coupled to the gate node of the second clamping transistor;
a third filter bank circuit coupled to the gate node of the third clamping transistor; and
a fourth filter bank circuit coupled to the gate node of the fourth clamping transistor.

\* \* \* \* \*